United States Patent [19]
Okino

[11] Patent Number: 5,912,467
[45] Date of Patent: Jun. 15, 1999

[54] METHOD AND APPARATUS FOR MEASUREMENT OF PATTERN FORMATION CHARACTERISTICS

[75] Inventor: Teruaki Okino, Kamakura, Japan

[73] Assignee: Nikon Corporation, Japan

[21] Appl. No.: 08/865,232

[22] Filed: May 28, 1997

[30] Foreign Application Priority Data

May 28, 1996 [JP] Japan ................................ 8-132987

[51] Int. Cl.[6] ............................................... H01J 37/304
[52] U.S. Cl. ................................. 250/491.1; 250/492.2
[58] Field of Search ........................... 250/491.1, 492.2, 250/398

[56] References Cited

U.S. PATENT DOCUMENTS

| | | | |
|---|---|---|---|
| 4,057,347 | 11/1977 | Moriyama et al. | 250/491.1 |
| 4,469,949 | 9/1984 | Mori et al. | 250/491.1 |
| 5,180,919 | 1/1993 | Oae et al. | 250/398 |
| 5,283,440 | 2/1994 | Sohda et al. | 250/492.2 |
| 5,379,108 | 1/1995 | Nose | 356/401 |
| 5,523,576 | 6/1996 | Koike et al. | 250/491.1 |
| 5,552,611 | 9/1996 | Encihen | 250/491.1 |

FOREIGN PATENT DOCUMENTS 4-144119   5/1992   Japan .
4-271112   9/1992   Japan .

Primary Examiner—Bruce Anderson
Attorney, Agent, or Firm—Klarquist Sparkman Campbell Leigh & Whinston, LLP

[57] ABSTRACT

The apparatus and methods of the present invention provide for the precise measurement and correction of pattern formation characteristics, such as the reduction factor and the rotation angle of projected images. The projected image measurement apparatus includes a projection optical system having a charged particle beam source, a mask, a mask stage, evaluation marks positioned on the mask or on the mask stage wherein such evaluation marks have set distances therebetween, a reference material defining reference marks, a device for moving the reference material, a device for detecting the amount of movement of the reference material, a device for detecting charged particle beams or reflected charged particles, a deflection system capable of shifting charged particle beams, a device for moving evaluation mark images near the reference mark, a device for ascertaining the amount of movement of the evaluation mark images during such measurements, a controller capable of calculating pattern formation characteristics from data obtained by such measurements, and a correction system for changing the image placement based on the correction data obtained and error amounts calculated. The precise position of the evaluation mark images are measured utilizing the reference marks and comparing such image positions to the actual positions of the evaluation marks on the mask. Such data are the basis for determining correction values for the pattern formation characteristics of the projection optics system.

21 Claims, 4 Drawing Sheets

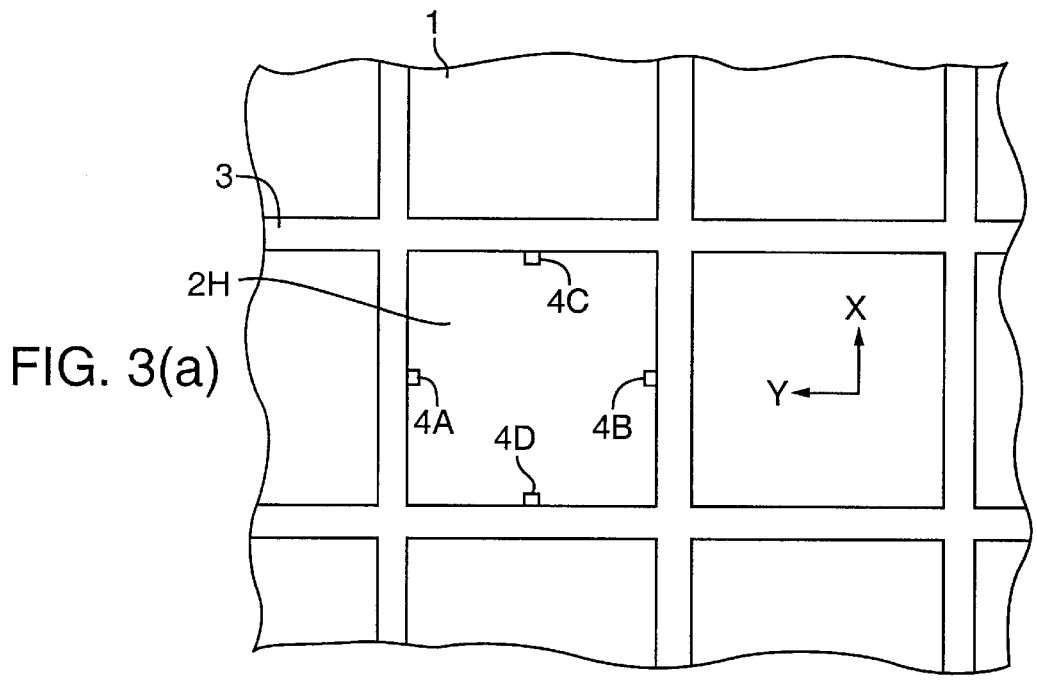
FIG. 3(a)
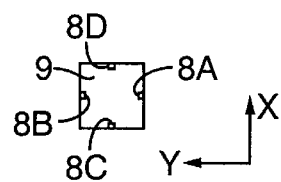
FIG. 3(b)
FIG. 4(a)
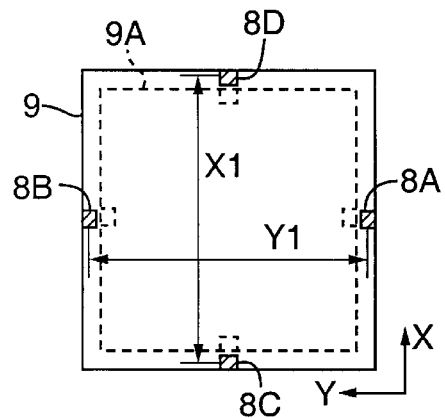
FIG. 4(b)
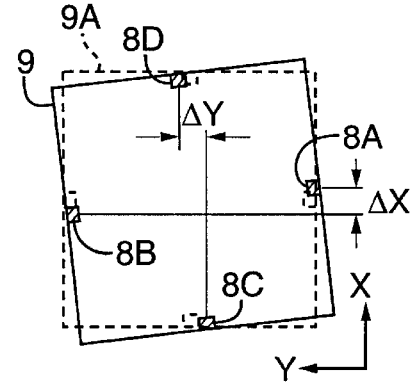

METHOD AND APPARATUS FOR MEASUREMENT OF PATTERN FORMATION CHARACTERISTICS

FIELD OF THE INVENTION

The present invention concerns apparatus and methods for the measurement and correction of pattern formation characteristics for the production of high resolution images projected by charged particle beam optics systems.

BACKGROUND OF THE INVENTION

Advances with charged particle beam transfer devices as used for making integrated circuits and related devices have made it possible to achieve both improved transfer pattern resolution and improved throughput (productivity) in recent years. One such device that has been investigated in the past uses a one-shot transfer system that transfers one die (meaning an entire pattern formed on a single layer for one of multiple integrated circuits) or multiple dies' worth of patterns from a mask onto a sensitive substrate in a single exposure ("shot"). However, with one-shot transfer systems, the masks which comprise the transfer original are difficult to make, and it is difficult to keep aberrations in the charge particle optical system (hereinafter referred to simply as the "optical system") to below a desired value inside of a large optical field of one die or greater. Therefore, devices using divided transfer systems have recently been studied, which divide the pattern, or total image field, which is to be transferred onto the substrate into multiple subfields, each subfield being smaller than the size of one die. In this divided transfer method, each subfield can be transferred and individually corrected for optical aberrations like focus, displacement, and distortion of the transferred image, so that good resolution and precise positioning of the image can be obtained over a wider total image field than with the one-shot transfer method.

However, sufficiently precise methods for the correction of image positioning errors, such as focal point errors and distortions of the projected image, have not been developed for the divided transfer method of image projection. In a previous attempt to measure and correct image positioning errors, first, a pattern forming a subfield of a mask is transferred onto a wafer. As is typical, the pattern is reduced in size by the projection optical system prior to being transferred on the wafer. Optical aberrations of a projected image are calculated according to the distance from the mask pattern subfield to the charged particle beam axis. The projected image is corrected as a function of this distance.

As the required density of integrated circuits on a die has increased, the required feature size of transferred images has decreased. When a large image is created by stitching together several projected images on the wafer, achieving the necessary precision is even more difficult. Such precision requirements demand precise placement of a subfield pattern onto the wafer, including precise reduction factors and rotation angles of the projected image. If these requirements are not satisfied, the subfields are not connected smoothly and the stitched-together large image lacks the required designed precision.

To maintain pattern formation characteristics, such as reduction factors and rotation angles of a projected mask subfield, within a set range, the actual image forming characteristics, such as reduction factor and rotation angle, must be measured precisely.

Although methods for the measurement of actual projected images have been previously disclosed, such methods are only suitable for correction of very small projected images.

Specifically, previously disclosed methods for the measurement of projected images are suitable for projected images of about $(5 \, \mu m)^2$ in area, as shown for example in Japanese laid-open patent H 7-22349. In such methods, several images are projected onto marks capable of reflecting or scattering charged particle beams, and the reflected or scattered charge particle beam are detected by a detector disposed near the marks. When a deflector scans an image formed by a charged particle beam over the marks, a signal is generated having several peaks due to the varying intensity of the scattered or reflected charge particles as the marks are scanned.

Using such charged particle beam mark detection methods, each subfield can be transferred with focus and distortion corrections, so that good resolution and precise positioning of the image can be obtained over a wider area than with the one-shot transfer method. A reduction factor and a rotation angle of the projected images are calculated utilizing the distance values between the detected signals. However, these measurement methods using charged particle beam deflection tend to have low precision due to the instability of deflection sensitivity of charged particle beams, such as electron particle beams, and due to varying rotational error of the deflection axis (causing scanning direction errors).

Nonetheless, using such a measurement method is sufficiently precise when the projected image is small, i.e., about $(5 \, \mu m)^2$, and when the required accuracy of the reduction factor is not too high. However, when using the divided transfer method, a subfield area on a mask is, typically, in the order of about 1 mm$^2$. If the reduction factor is one quarter the size of the mask pattern, as is typical, then the projected image of the subfield pattern will be $(250 \, \mu m)^2$. Consequently, known methods do not provide methods and apparatus capable of obtaining sufficiently precise measurements of the projected images. Accordingly, methods and apparatus are needed in order to measure and correct pattern formation characteristics, so as to produce transferred images having the required performance suitable for wide field range pattern microlithography methods, such as divided transfer methods.

SUMMARY OF THE INVENTION

The apparatus and methods of the present invention provide for the precise measurement and correction of pattern formation characteristics, such as the reduction factor and the rotation angle of projected images.

The projected image measurement apparatus of the present invention includes a projection optical system having a charged particle beam source, a mask, a mask stage, evaluation marks positioned on the mask or on the mask stage wherein such evaluation marks have set distances therebetween, a reference material defining reference marks, a device for moving the reference material, a device for detecting the amount of movement of the reference material, a device for detecting charged particle beams or reflected charged particles, a deflection system capable of shifting charged particle beams, a device for moving evaluation mark images near the reference mark, a device for ascertaining the amount of movement of the evaluation mark images during such measurements, a controller capable of calculating pattern formation characteristics from data obtained by such measurements, and a correction system for changing the image placement based on the correction data calculated. A representative method of the present invention utilizes the apparatus of the present invention as follows.

Evaluation marks having set distances therebetween are placed on the mask stage or the mask. The reference material having reference marks is positioned adjacent to a wafer. A charged particle beam is projected through the evaluation marks and images of the evaluation marks are formed on the wafer.

Next, the exact position of each evaluation mark image created by the projection optical system is determined by, first, placing the reference mark near a first evaluation mark image. The first evaluation mark image is then moved forward relative to the reference mark. A first Y-axis coordinate is determined at the point where the edge of the reference mark crosses the center of the evaluation mark image. Next, the reference mark is moved along the Y-axis direction to a position near a second evaluation mark image. The second evaluation mark image is then moved forward relative to the reference mark and a second Y-axis coordinate is obtained at the point in which the reference mark crosses the center of the second evaluation mark image. Finally, the difference of the first and second Y-axis coordinates is calculated to determine the actual distance between the two evaluation mark images. The same procedure is followed for evaluation marks positioned along the X axis.

The reduction factor is then calculated by comparing the positions of the evaluation mark images on both the X axis and the Y axis to the positions of the evaluation marks on the mask. Additionally, the rotation angle of the projected image is calculated by measuring the relative positions of the evaluation mark images on both the X axis and the Y axis and by dividing the difference between the relative positions of the evaluation mark images by the distance between the evaluation marks on the mask.

Because the distance of movement of the reference mark may be obtained, for example, by a laser interferometer, the measurement is performed quickly and precisely. Additionally, only a few movements of the reference mark is necessary to perform the measurements according to the present invention. Moreover, the evaluation mark images are preferably moved via electrical shifting, which also allows quick and precise determination of the image position. Accordingly, the entire measurement method may be completed in a relatively short period of time. Moreover, based on the precise measurements, correction of projected images is performed. Thus, it is possible to provide images of high precision even when the images are stitched together. Accordingly, the present invention provides the requisite highly precise wide area imaging and the desired rapid throughput.

The present invention also provides the advantage of maintaining the pattern formation characteristics in ideal condition by periodic use of the measurement and correction system of the present invention.

BRIEF DESCRIPTION OF THE DRAWINGS

FIG. 3(a) is a partial plan view of a mask pattern subfield including an embodiment of evaluation marks of the present invention.

FIG. 3(b) is a partial view of projected images of the evaluation marks illustrated in FIG. 3(a).

FIG. 4(a) shows an incorrectly reduced projected image of the subfield and evaluation marks illustrated in FIG. 3(a).

FIG. 4(b) shows a misaligned projected image of the subfield and evaluation marks illustrated in FIG. 3(a).

DETAILED DESCRIPTION

Figure 1:
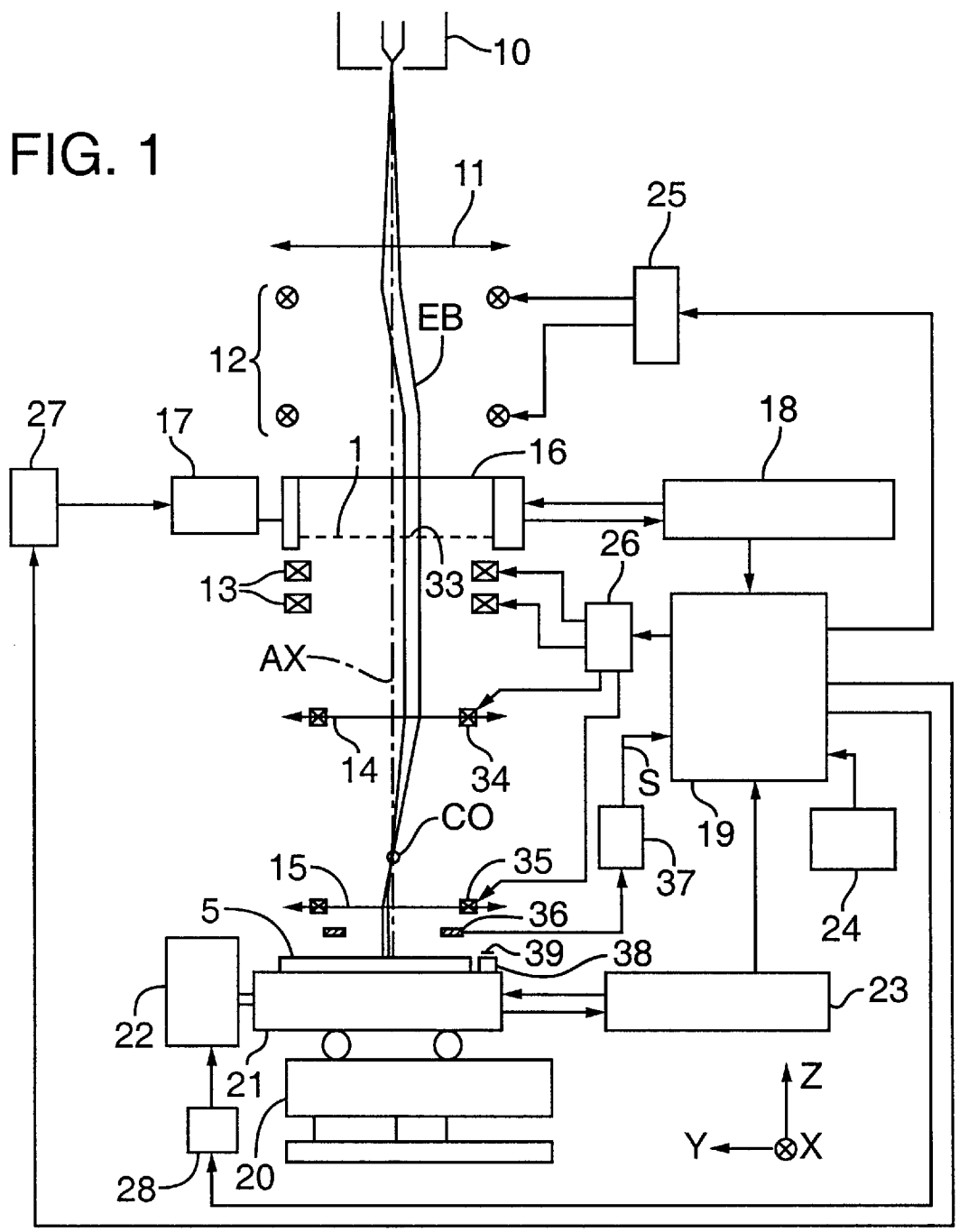
FIG. 1 is a schematic view of an electron beam projection apparatus incorporating an embodiment of the optical projection measurement and correction apparatus of the present invention.

A preferred embodiment of a projected image measurement apparatus of the present invention includes the following (FIG. 1): a projection optical system having a charged particle beam source 10, a mask 1, and a mask stage 16. The following additional features are discussed below but not detailed in FIG. 1: evaluation marks 4A, 4B, 4C, 4D, etc. positioned on the mask 1 or the mask stage 16 and having set distances therebetween, a reference material 38 having a reference mark 39, a device 22 for moving the reference material, a device 23 for detecting the amount of movement of the reference material, a device 36 for detecting charged particles or reflected charged particles, a first deflection system 12 capable of directing a charged particle beam, a second deflection system 13 capable of directing a charged particle beam and for moving evaluation mark images 8A, 8B, 8C, 8D, etc. near the reference mark, a main control system 19 for calculating the amount of correction necessary to produce the correct reduction factor, angle of rotation, deflection factor, and focal point of any mask pattern image transferred, and a correction system for changing the image placement based on the correction data calculated.

The projected image measurement apparatus of the present invention is described herein by means of an electron beam lithography projection exposure system (a "stepper"). It is understood that the apparatus and method of the present invention is suitable for use with any of a variety of projection optical systems, and, in particular, for use with charged particle beam optical projection systems, such as ion beam microlithography steppers.

FIG. 1 illustrates the preferred features of an electron beam projection system incorporating an embodiment of the apparatus of the present invention. The electron beam stepper system, as illustrated in FIG. 1, has an electron charged particle beam axis AX parallel to the Z axis. The Y axis is horizontally oriented, extending perpendicular to the AX axis, in a left to right direction, as illustrated in FIG. 1. The X axis perpendicularly intersects both the Y and AX axes. Viewing FIG. 1, the X axis is perpendicular to the plane defined by the page depicting FIG. 1 and extends along a line projecting inwardly into and outwardly from the page.

The electron beam stepper system includes an electron gun 10 (or analogous charged particle source) that discharges an electron beam in a direction extending along the AX axis. A condenser lens 11 transforms the electron beam into a parallel beam. An optical field selecting deflector 12, comprising two electromagnetic deflectors layered on top of one another, shifts the parallel electron beam in a direction along the Y axis.

A mask 1 is positioned on a mask stage 16 in a direction parallel to the X and Y axes. The mask stage 16 may be moved by a motor 17, in a continuous manner along the X axis, and may be shifted in a step-wise manner or in a continuous manner along the Y axis. The position of the mask stage 16 is detected by a first laser interferometer 18. The first laser interferometer 18 conveys signals related to the mask stage 16 positions to the main control system 19 wherein such positions are recorded.

Figure 2:
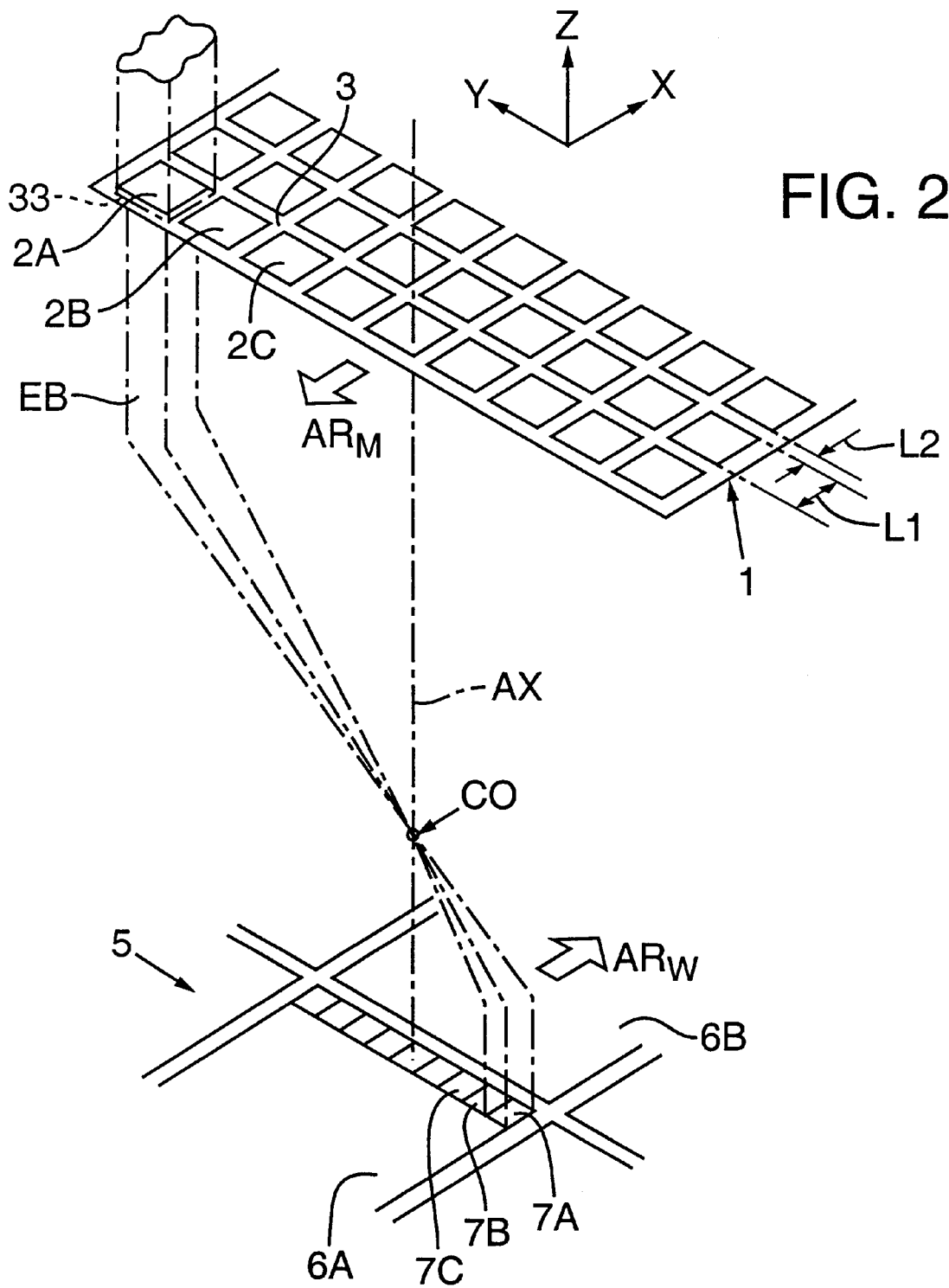
FIG. 2 is a partial view of a mask and substrate illustrating projection of mask pattern subfields onto the substrate.

Referring to FIG. 2, the parallel electron beam is projected through a projection area 33 encompassing a subfield 2A of the mask 1. A deflection control 25 (FIG. 1) controls the amount in which the optical field selecting deflector 12 shifts the electron beam. The deflection control 25 is, in turn, controlled by the main controller system 19. In an alternative embodiment, an electrostatic deflector may be used rather than the electromagnetic optical field selecting deflector 12.

The electron beam projected through the mask 1 is then shifted a predetermined amount by a deflection system 13. The deflection system 13 may comprise two electromagnetic deflectors controlled by the main control system 19 via a deflection correction control 26.

The electron beam is then directed through a projection lens 14, converging at a cross-over point CO and is projected through an objective lens 15 to expose the substrate surface. For simplicity, the substrate is hereinafter referred to as a "wafer" 5. It is understood that a variety of substrates may be suitable for practicing the present invention.

The wafer 5 may include any variety of lithography resists known to persons skilled in the relevant art. An image of the mask pattern (i.e., the projected subfield) is transferred to a predetermined position on the wafer 5 surface. The transferred image will have a preselected reduction factor, for example, one fourth the size of the mask pattern subfield.

Referring to FIG. 1 and FIG. 3(a), when utilizing the divided transfer method, divided patterns or subfields on the mask 1 are placed between the boundary areas 3. As each subfield forms an image on the wafer 5, the transferred images are set immediately adjacent one another on the wafer, leaving no space therebetween. Accordingly, when a subfield is projected onto the wafer 5, the deflection system 13 is utilized to shift the electron beam in a horizontal direction (i.e., along the y-axis) an amount equal to the width of the corresponding boundary area 3. The deflection system 13 is also used to deflect the electron beam to correct or change pattern formation characteristics of projected images, as described below.

The deflection system 13 may comprise an electrostatic deflector rather than an electromagnetic deflector. Alternatively, the deflection system 13 may combine an electrostatic deflector and an electromagnetic deflector.

Returning to FIG. 1, corrective lenses 34, 35 are placed within the projection lens 14 and the objective lens 15, respectively. The corrective lenses 34, 35 are used to correct the pattern formation characteristics, such as the reduction factor and rotation angle of a projected image. The main control system 19 calculates the amount of correction to be made by the corrective lenses 34, 35. The main control system 19 conveys the amount of correction required to the corrective lenses 34, 35, and such correction is implemented (i.e., the image is shifted as required) by the lenses 34, 35, via the deflection correction control 26. Coreless coils are, preferably, used for the corrective lenses 34, 35. A reflected electron detector 36 is positioned down stream of the objective lens 15 to detect electrons reflected from the surface of the wafer 5. A signal from the reflected electron detector 36 is transferred to the main control system 19 by a signal circuit 37. Thus, a reflected electron signal S is created. The main control system 19 utilizes the reflected electron signal S to determine the position of an evaluation mark image, as explained below.

The wafer 5 is held by a wafer stage 21, positioned parallel to the X and Y axes. The wafer stage 21 is positioned on a second stage 20. Reference material 38 is positioned on the wafer stage 21 adjacent the wafer 5. The reference material 38 is preferably positioned such that the upper surface of the reference material is at about the same height as the surface of the wafer 5. A reference mark 39 is positioned on the surface of the reference material 38. The reference material 38 preferably is comprised of a silicon wafer, while the reference mark 39, preferably, comprises a thin square film of tantalum. The wafer stage 21 is capable of moving the wafer 5 and the reference material 38 in a continuous manner or in a step-wise manner. During operation, the wafer stage 21 is moved in a direction opposite to the direction of movement of mask stage 16 because the image of the mask pattern is inverted by the projection lens 14 and the objective lens 15.

The wafer stage 21 is moved by a motor 22. The position of the wafer stage 21 is detected by a second laser interferometer 23. The position of the wafer stage 21, as detected by the laser interferometer 23, is signalled to the main control system 19 where the information is stored and used for calculation of projected image characteristics.

The main control system 19 also calculates the amount the electron beam is shifted by the optical field selecting deflector 12 and the deflection system 13. This calculation is performed using data supplied by the first laser interferometer 18, the second laser interferometer 23 and an input device 24. The input device 24 provides data regarding the transfer conditions such as position data and/or relative speed data of the mask and the wafer stage. The input device 24 may comprise a device that reads information stored in magnetic storage, i.e., the data created, by the control system 19, for example, to provide transfer condition data. Alternatively, an input device 24 operable to read transfer data from the mask 1 and the wafer 5 can be used.

The main control system 19 determines and provides signals via drivers 27, 28 to the mask stage 16 and the wafer stage 21 motors, indicating required movement and positioning. Each driver 27, 28 controls the movement produced by each motor 17, 22, respectively.

The main control system 19 also determines the requisite amount in which the electron beam is to be shifted. Signals indicating the requisite shift amount are provided to the optical field selecting deflector 12 and the deflection system 13 via the deflection control 25 and the shift correction control 26, respectively.

Next, an embodiment of the method of the present invention is described. The method of the present invention provides generally for the transfer of an image from a mask onto a wafer. The method, preferably, utilizes the optical projection measurement and correction apparatus of the present invention.

Again, for ease of discussion, the method of the present invention is described in terms of electron beam lithography. It is understood that the present method is suitable for a variety of optical projection systems, such as ion beam lithography.

As illustrated in FIG. 2, the pattern on the mask 1 is divided into subfields 2A, 2B, 2C, etc. along the X and Y axes. Boundary areas 3 are located between each subfield. The subfield being projected, illustrated in FIG. 2 with subfield 2A, has a projection area 33. An electron beam is projected from an electron beam source 10 to the projection area 33.

Electron transmissive areas are arranged on the mask 1 in accordance with the respective subfield 2A, 2B, 2C, etc., pattern to be transferred to the wafer 5. Any of a variety of masks may be used to practice the present invention. For example, the mask may comprise a thin-film layer of silicon nitride to create the electron transmissive areas of the pattern while tungsten is placed on selected areas of the mask to create electron-blocking or scattering regions of the mask pattern. Another mask suitable for practicing the present invention may comprise a mask formed of silicon as the electron scattering substance and punch holes as the transmissive portions of the mask pattern. The boundary areas 3 on the mask 1 are also comprised of a blocking material. The blocking material may comprise any of a variety of materials known to persons skilled in the relevant art.

The electron beam is projected through the subfield 2A on the mask 1. The beam is then directed through the projection lens 14 and the objective lens 15 and a reduced image of the subfield 2A pattern is exposed on the corresponding transfer area 7A on the surface of the wafer 5.

The electron beam is projected through each subfield 2A, 2B, 2C, etc., in order. Thus, the reduced image of each pattern of each subfield is transferred to the corresponding transfer area 7A, 7B, 7C, etc., on the wafer 5. As this projection occurs, the electron beam is shifted, by the deflection system 13 (FIG. 1), an amount equal to the length of the boundary area 3 bordering that subfield. There are, preferably, no spaces on the surface wafer between each transfer area 7A, 7B, 7C, etc.

The mask 1 is continuously shifted in a negative X axis direction, as indicated by the upper arrow $AR_M$ in FIG. 2. The mask 1 is shifted at a predetermined speed ($V_M$). Simultaneously, the wafer 5 is shifted in the positive X axis direction, as indicated by the lower arrow $AR_W$ in FIG. 2. The wafer 5 is also shifted at the speed ($V_W$).

To obtain the desired speed $V_W$, suppose the reduction factor of the projection lens 14 and the objective lens 15 of the pattern projected onto the wafer 5 is denoted by β. Referring to FIG. 2, for each subfield 2A, 2B, 2C, etc., the length of an edge of such subfield that is parallel to the X axis is denoted by L1. Additionally, the length of the boundary 3 bordering that subfield that is parallel to the Y axis, is denoted by L2. The speed ($V_W$) is, preferably, equal to:

$$V_W = \beta \times (L1/(L1+L2)) \times V_M \quad (1)$$

Referring to FIG. 2, the electron beam is projected in order through each subfield 2A, 2B, 2C, etc. in a direction along the Y axis by deflection of the electron beam caused by the subfield selecting deflector 12, after which the subfields in the next row are projected. Thus, the pattern of each mask subfield is transferred, one by one, onto a transfer area 6A on the wafer 5. The transfer area 6A represents one die on the wafer 5. For each die, these steps are executed continuously until all of the mask patterns of all the subfields are transferred to the wafer 5. At this point, the transfer of a single die or transfer area 6A on the wafer 5 is complete.

The method of the present invention also provides for measurement and correction of projected pattern formation characteristics as follows. For simplicity, the embodiments of the measurement and correction methods of the present invention are described in terms of electron beam lithography, as discussed above.

A focal point correction and correction of distortions of an image, such as correction of the reduction factor and rotation angle, are performed during the transfer process. For clarity, these corrections are discussed in terms of a single image of a subfield formed on the wafer 5. The correction is performed subfield-by-subfield. After such corrections are made, the steps discussed above are repeated to transfer images of the mask 1 pattern to the next die or transfer area 6B on the wafer 5, until all dies on the wafer are completed.

Referring to FIG. 3(a), in a representative embodiment of the method of the present invention, a subfield 2H is a square area on the mask 1 surrounded by boundary area 3. Four evaluation marks 4A, 4B, 4C, 4D are, preferably, positioned on the four edges of the subfield 2H as depicted in FIG. 3(a).

Evaluation marks 4A, 4B having a set distance therebetween, are positioned in a line parallel to the Y axis of FIG. 3(a). Evaluation marks 4C, 4D, also having a set distance therebetween, are positioned along a line parallel to the X axis.

To measure the projection formation characteristics, first, the center of the subfield 2H is positioned approximately on the center of the electron beam axis (AX) (see FIGS. 1 and 2). The placement of the center of subfield 2H is performed by moving the mask stage 16. The center of the reference material 38 is also positioned approximately on the AX axis, by moving the wafer stage 21. The electron beam is then projected on the subfield 2H of the mask 1. A reduced image of the subfield 2H pattern is projected on the reference material 38. The subfield 2H image is reduced by projection of the electron beam through the projection lens 14 and the objective lens 15, as discussed above.

FIG. 3(b) illustrates a projected image 9 of the pattern of the subfield 2H. The four evaluation mark images 8A, 8B, 8C, 8D correspond to the four evaluation marks 4A, 4B, 4C, 4D, respectively. These images are also reduced in size relative to the marks 4A, 4B, 4C, 4D. As with the evaluation marks on subfield 2H of mask 1, the evaluation mark images are positioned on the four edges of the projected image 9.

For illustration purposes, suppose the reduction factor β is one quarter. Now suppose the projected image 9 is (250 $\mu$m)$^2$ in area and the evaluation mark images 8A, 8B, 8C, 8D are (5 $\mu$m)$^2$ in area. Suppose also that the reference mark 39 on the reference material 38 is (80 $\mu$m)$^2$ in area.

Now, as is typically the case, suppose there are errors in the reduction factor and rotation angles of the projected image 9. Consequently, there would be some positioning errors of the evaluation mark images 8A, 8B, 8C, 8D on the projected image 9. To correct such errors, one embodiment of the present invention provides the following steps.

FIG. 4(a) illustrates an error in the reduction factor β of projected image 9. Dashed line 9A depicts an outline of a projected image 9 having no error in the reduction factor and no error in the rotation angle of the projected image.

The value "Y1," equal to the distance between the centers of the evaluation mark images 8A, 8B is first measured. The value "X1," equal to the distance between the centers of the evaluation mark images 8C, 8D is next measured. The corresponding distances between 4A and 4B, and between 4C and 4D are divided by the values of Y1 and X1, respectively. The actual reduction factor for the reduction of the image along the direction of the Y axis $\beta_y$, and the reduction factor for the image along the direction of the X axis $\beta_x$ are calculated. By subtraction of these actual reduction factors from the ideal or theoretical reduction factor β, an error range of the reduction factors is obtained.

FIG. 4(b) illustrates a rotation angle error of the projected image 9. Dashed line 9A is an outline of a projected image having no reduction factor error and no rotation angle error. A line, parallel to the Y axis, is drawn from the center of each evaluation mark image 8A and 8B. The shift amount of the image along the X axis (ΔX) is equal to the distance between the two lines drawn from the center of each evaluation mark 8A, 8B (see FIG. 4(b)). Next, a line, parallel to the X axis, is drawn from the center of each evaluation mark image 8C and 8D. The shift amount of the image along the Y axis (ΔY) is equal to the distance between the two lines drawn from the center of each evaluation mark 8C, 8D.

The shift amount ΔX is then divided by the distance between the evaluation mark images 8A and 8B. The resulting value to the actual rotation angle $\theta_y$ of the projected image as measured along the Y axis. The shift amount ΔY is divided by the distance between evaluation mark images 8C and 8D. The resulting value is the actual rotation angle $\theta_x$ of the projected image as measured along the X axis.

The error range for each rotation angle is obtained by subtracting the ideal angle of rotation from the actual angle of rotation, as measured and calculated above. Additionally, by subtracting the value of $\theta_Y$ from the value of $\theta_x$, or vice versa, orthogonality of the projected image may be obtained. Based on the calculated error ranges, the electron beam is shifted as appropriate and the mask pattern is them projected onto the wafer as discussed above, effectively eliminating projection formation characteristic errors.

In another embodiment of the method of the present invention, reduction factor and refraction angle errors of the projected image 9 are measured and corrected in the following manner.

Figure 5A:
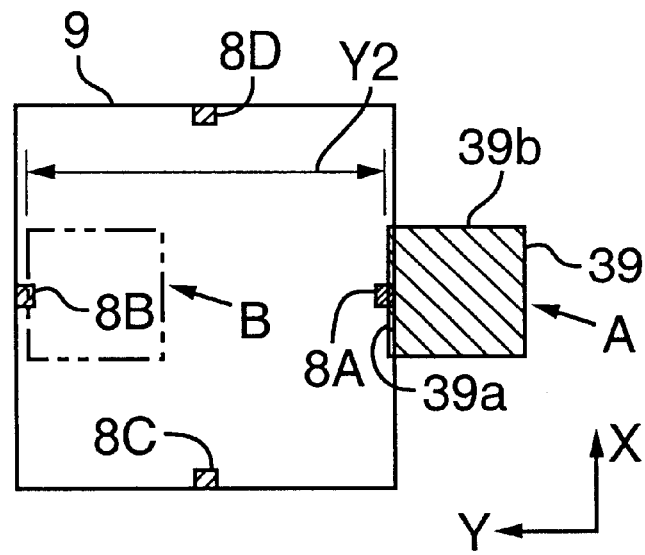
FIG. 5(a) is a partial view of a substrate having projected images of the subfield and evaluation marks illustrated in FIG. 3(a) and a reference mark of the present invention.

First, the distance between two of the four evaluation mark images 8A, 8B, 8C, 8D are measured in both the X axis and the Y axis directions. In this embodiment, the reference material 38 is used to measure the distance Y1 between the evaluation mark images 8A and 8B. The distance Y1 is measured from the center of the evaluation mark image 8A to the center of the evaluation mark image 8B along the Y axis direction. With reference to FIG. 5(a), a projected image 9 of the subfield 2H mask pattern is first projected along the electron beam axis (AX).

The reference material 38 is then moved relative to the axis AX by the wafer stage 21 (FIG. 1). The edge 39a of the reference mark 39 on reference material 38 is then positioned on the center of the evaluation mark image 8A. At this point, movement of the wafer stage 21 is paused. This position is illustrated as position A in FIG. 5(a). Using the second laser interferometer 23 (FIG. 1) this position of the wafer stage 21 is obtained and saved in memory as X, Y axes coordinates by the main control system 19. At this point, the shift amount of the deflection system 13 (FIG. 1) is equal to zero.

Next, the deflection system 13 shifts the projected image 9 along the direction of the Y axis, as illustrated in FIG. 5(a) such that evaluation mark image 8A is moved across the edge 39a of the reference mark 39. At the same time, the main control system 19 (FIG. 1) reads signals generated by the signal circuit 37 as obtained by the reflected electron detector 36. These values are the reflected electron signal S. That is, as the electron beam is projected to produce the evaluation mark image 8A, the reference mark 39 reflects a portion of the electrons in the electron flux. The reflected electron signal S is based on the amount of the electron flux reflected by the reference mark 39. The shift amounts ΔX and ΔY of the evaluation mark images 8A, 8B, 8C, 8D may then be measured accordingly.

Figure 5B:
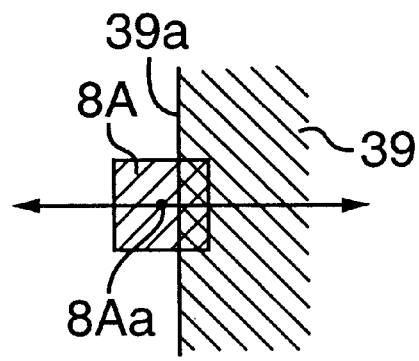
FIG. 5(b) illustrates a partial view of the projected evaluation mark image and reference mark of FIG. 5(a).
Figure 5C:
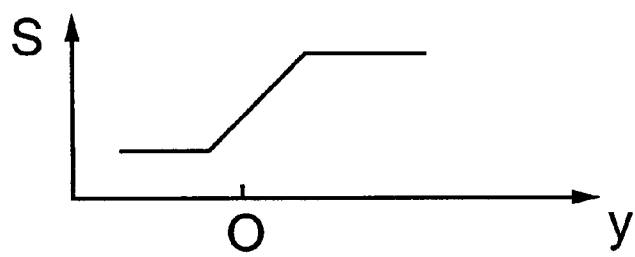
FIG. 5(c) is a graph of reflected electron signals obtained by shifting the projected evaluation mark images of FIG. 5(a).

Specifically, the shift amount of the deflection system 13 is converted to a shift amount of the projected image along the Y axis as measured by the laser interferometer 23. Such a conversion formula, known to persons skilled in the relevant art, is preprogrammed in the main control system 19. Referring to FIG. 5(c), the Y zero coordinate is equal to the Y coordinate of the center of the evaluation mark image 8A when the shift amount of the deflection system 13 is equal to zero. The reflected electron signals S are plotted (graph of FIG. 5(c)) as obtained above and the function of the reflected electron signals S is saved by the main control system 19.

Figure 5D:
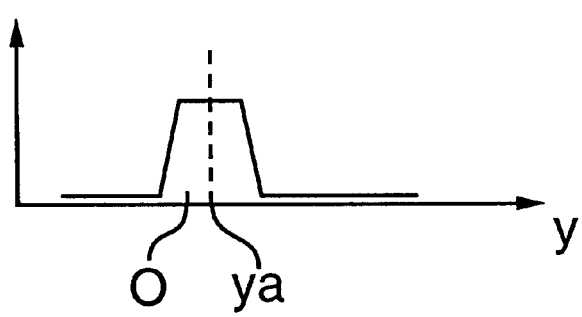
FIG. 5(d) is a graph of the values obtained by differentiating the reflected electron signals of FIG. 5(c).

The main control system 19 then calculates a differential signal (dS/dy) by differentiating the reflected electron signals S obtained above by the corresponding Y coordinates. These differential signals (dS/dy) are trapezoidal in shape, as illustrated in the graph of FIG. 5(d). The Y coordinate ya, as shown by the dashed center line in 5(d), is the distance between the center of the evaluation mark image 8A and the edge 39a of the reference mark 39 (FIG. 5(b)). Thus, the Y coordinate ya is equal to the shift amount of the evaluation mark image 8A on the Y axis of the wafer stage 21.

Next, referring back to FIG. 5(a), in this embodiment of the method of the present invention, the reference material 38 is moved by the wafer stage 21. As illustrated by the dashed line in FIG. 5(a), the reference material 38 is moved such that the center of the edge 39a of reference mark 39 is positioned on the center of the second evaluation mark image 8B. At this point, the wafer stage 21 is paused, and the position of the wafer stage 21 (position B) is obtained by the second laser interferometer 23. This Y axis coordinate is recorded by the main control system 19 (i.e., when in position B). In FIG. 5(a), Y2 is equal to the difference in the Y coordinate at position A and the Y coordinate at position B.

As was described above in relation to the calculation of the shift amount of evaluation mark 8A, the shift amount of evaluation mark 8B is determined. The deflection system 13 (FIG. 1) shifts the projected image 9 in the direction of the Y axis (see FIG. 5(a)). The evaluation mark image 8B is moved across the edge 39a of the reference mark 39. The reflected electron signals S are detected. The distance between the center of the evaluation mark image 8B (position B in FIG. 5(a)) and the edge 39a of the reference mark 39 is determined. As above, the distance is determined by calculating the center position of the reflected electron signals S utilizing differential calculus. The distance is the evaluation mark image 8A shift amount "yb" on the Y axis. The sign for the shift amount is positive in the direction where the distances between the evaluation mark images get smaller. In the direction where the distances therebetween get larger, the shift amount is negative.

The main control system 19 then calculates the distance Y1. Y1 is equal to the distance between the positions of the evaluation mark images 8A and 8B minus the relevant shift amounts. Specifically, the distance Y1 is calculated as follows:

$$Y1 = Y2 - ya - yb \qquad (2)$$

Utilizing equation (2) and the image areas illustrated above, the value of Y2 will be equal to, approximately, (250 $\mu$m)$^2$ in area. The shift amounts ya and yb will be approximately (5 $\mu$m)$^2$ each. Thus, the value of Y1 is almost entirely based upon the value of Y2 as measured by the laser interferometer. This allows the value of Y1 to be measured precisely. Additionally, if there is error in shift amounts produced by the deflection system 13, the error will be relatively small and is, also, then correctable. Even with the maximum amount of shifting performed, the actual shift amount (ya, yb) of each evaluation mark image from the center will be relatively small. Thus, there is no significant influence by the shift amounts upon the measurement precision of the method of the present invention.

Similarly, The distance X1 between the evaluation mark images 8C and 8D (FIG. 4(a)) can be obtained. This distance is obtained by measuring from the edge 39b of the reference mark 39 along the direction of the X axis (FIG. 5(a)). As discussed above, the shift amount ΔX of evaluation mark images 8A, 8B and the shift amount ΔY of evaluation mark images 8C, 8D are also precisely measured by the method of the present invention.

Accordingly, from the distance values and shift amounts calculated by this embodiment of the present invention, reduction factor errors and rotation angle errors of the projected image 9 are obtained. The main control system 19 then eliminates the errors through signals sent to the correction control 26. The correction control 26 shifts the electron beam as directed by the main control system 19 through manipulation of corrective lenses 34, 35.

In another embodiment of the present invention, rotation angle errors obtained by the method outlined above are corrected by rotating the mask 1 and/or the wafer 5 the amount necessary to correct such rotation angle error. Reduction factor errors obtained using the method of the present invention are corrected by moving the mask 1 and the wafer 5 the appropriate amount in a direction along the Z axis.

The image formation characteristics measurement apparatus and method of the present invention allow the reduction factor and rotation angle of a projected image of a pattern of a subfield on a mask to be precisely corrected. Therefore, error rates in the stitching of transferred images on the wafer 5 may, in turn, be kept to an absolute minimum, thereby allowing high precision lithography.

In yet another embodiment of the present invention, five or more evaluation marks are utilized. The distances between the evaluation marks are measured. In this embodiment, a Y coordinate for each evaluation mark image is measured using a specific edge of a specific reference mark, for example, edge 39a of reference mark 39. The X coordinate for each evaluation mark image is measured using a different edge of the reference mark, for example, edge 39b of reference mark 39 (see FIG. 5(a)). However, when obtaining the Y and X coordinates of the evaluation mark images, it is important that other evaluation mark images do not cross over the reference mark, so that signals from more than one mark are not confused.

When more than five evaluation marks are used, the distances between evaluation mark images and rotation angles of evaluation mark images, along both the X and Y axes, can be determined with great precision. Such data can be measured even more precisely by using the least squares method. Accordingly, imaging errors can be measured and corrected.

Furthermore, an optimal focal point of a projected image may also be measured using the method of the present invention. To measure an optimal focal point, the position of the reference material 38 is changed along the Z axis direction by suitable means, such as a piezoelectric device. The width of an evaluation mark image is then measured. The point at which the width of the evaluation mark image is the smallest along the Z axis is determined. At this position the evaluation mark image is at its sharpest. This position represents the optimal focal point.

Alternatively, the optimal focal point may be obtained by changing the power of the projection lens 14 and/or the power of the objective lens 15. The objective lens 15 controls the distance of the focal point. The width of each evaluation mark image is measured at each power setting. A correction of any focal point error can then be performed dynamically by the projection lens 14 and the objective lens 15.

In another embodiment of the present invention, the wafer stage 21 is moved continuously, and each evaluation mark image is shifted relative to an edge 39a or 39b of the reference mark 39 (FIG. 5(a)). Then, positioning data of each evaluation mark image is measured based on the data measured by the laser interferometer 23 rotation angle error and reduction factor error are then calculated and corrected based on the method described herein.

In yet another embodiment of the present invention, the reference material 38, having a reference mark 39, is placed at a fixed position. The mask stage 16 is then moved without shifting the electron beam. The evaluation mark of the mask is consequently moved in reference to the edge 39a of the reference mark 39. The positioning data is then calculated as described in the methods set forth above. Appropriate correction of distortions are them implemented.

The above embodiments of the present invention utilize a square reference mark 39, wherein edges of the reference mark 39 along the X and Y axes are used for measurement purposes. Alternatively, rectangular reference marks may be used wherein one rectangular reference mark possesses a set of longer edges in the Y-axis direction while another rectangular reference mark possesses a set of longer edges in the X-axis direction. The longer set of edges of each such reference mark is utilized for the measurements outlined in the methods of the present invention.

In the above embodiments, the evaluation marks utilized to evaluate the pattern formation characteristics of projected images are situated on the mask. Alternatively, the evaluation marks may be situated on the mask stage 16. Accordingly, the image of the evaluation mark placed on the mask stage 16 is projected and measured as described above.

Additionally, secondary electrons from the reference mark 39 may be used for detection, if the reference mark emits secondary electrons.

In yet another embodiment of the present invention, another form of mark is used for the reference mark. For example, an etching mark and a knife edge mark can be used for reference mark 39. When a knife edge mark is used as a reference mark, absorbed electrons are detected, rather than detecting reflected electrons as described above.

Having illustrated and described the principles of the invention with several preferred embodiments, it should be apparent to those skilled in the art that the invention can be modified in arrangement and detail without departing from such principles. I claim all the modifications coming within the spirit and scope of the following claims.

What is claimed is:

1. A charged particle beam exposure apparatus comprising:

(a) a charged particle beam source;

(b) a fixed pattern comprising multiple evaluation marks situated to allow the charged particle beam to propagate in a direction through the evaluation marks to form an image of the evaluation marks of the fixed pattern;

(c) a reference material on which the image of the evaluation marks is formed by the charged particle beam, the reference material having a reference mark;

(d) an optical system for transferring the charged particle beam to produce the image of the evaluation marks on the reference material;

(e) a first stage for moving the reference material with the reference mark relative to the image of the evaluation marks;

(f) a first detector for detecting the amount of movement of the reference mark relative to an image of an evaluation mark, for determining a distance of the reference mark relative to the image of the evaluation mark, and for outputting data indicative of the distance;

(g) a deflection system for deflecting the charged particle beam so as to move the image of the evaluation mark relative to the reference mark;

(h) a second detector for detecting charged particles reflected by the reference mark as the image of the evaluation mark is moved relative to the reference mark and for outputting data indicative of the position of the image of the evaluation mark relative to the reference mark; and (i) a main control system to which the first and second detectors are connected, the main control system for determining, from the data from the first and second detectors, a reduction factor and a rotation angle of the image of the evaluation mark relative to the reference mark on the reference material, and for determining an amount of correction necessary to achieve a desired reduction factor and rotation angle.

2. The apparatus of claim 1, wherein the fixed pattern of evaluation marks is defined by a mask, and wherein the main control system further determines, from the data from the first and second detectors, distortion and orthogonality of the image of the evaluation mark relative to the reference mark on the reference material, and further determines an amount of correction necessary to achieve a desired distortion and orthogonality.

3. The apparatus of claim 2, further comprising a correction system, for correcting reduction factor and rotation angle, comprising a first corrective lens and a second corrective lens through which the charged particle beam propagates, the first corrective lens and the second corrective lens being in electrical communication with the main control system for altering the propagation direction of the charged particle beam in accordance with the amounts of correction determined by the main control system to achieve the desired reduction factor and rotation angle.

4. The system of claim 2, further comprising:
a second stage upon which the mask is positioned; and
a second stage positional detector for detecting the amount of movement of the second stage in a plane transverse to a propagation axis of the charged particle beam, the second stage detector being for determining the position of the second stage and outputting data to the main control system, the data being indicative of the second stage position relative to the propagation direction of the charged particle beam.

5. The system of claim 4, wherein the second stage detector comprises a second laser interferometer.

6. The apparatus of claim 4, wherein the fixed pattern of evaluation marks are defined by the second stage, upon which second stage a mask is positioned adjacent the pattern of evaluation marks.

7. The apparatus of claim 6, further including a substrate to which images of a pattern on the mask are transferred by the charged particle beam, wherein the substrate is placed adjacent the reference material on the first stage.

8. The apparatus of claim 7, wherein the reference material is positioned so that a surface of the reference material is substantially coplanar with a surface of the substrate.

9. The apparatus of claim 2, wherein the mask includes multiple subfield situated to allow the charged particle beam to pass through the subfields, each subfield including a fixed pattern of evaluation marks.

10. The apparatus of claim 1, wherein the first detector comprises a first laser interferometer.

11. The apparatus of claim 1, wherein the fixed pattern comprising evaluation marks is defined by a mask, wherein a separate evaluation mark is positioned on the periphery of each of four sides of an image area defined by the mask, the image are being substantially square in shape.

12. The apparatus of claim 11, wherein each evaluation mark of the fixed pattern is positioned substantially at a midpoint of each side of the image area.

13. The apparatus of claim 11, wherein the evaluation marks are positioned so that a center of a first evaluation mark is axially aligned with a center of a second evaluation mark and a center of a third evaluation mark is axially aligned with a center of a fourth evaluation mark.

14. The apparatus of claim 1, wherein the reference mark is substantially rectangular in shape.

15. A charged particle beam measurement method, comprising the steps of:

(a) emitting a charged particle beam;

(b) passing the charged particle beam through a fixed pattern of multiple evaluation marks to produce an image of the fixed pattern, each evaluation mark having a center;

(c) positioning a reference material, comprising a reference mark, relative to the charged particle beam so as to form the image of the fixed pattern of evaluation marks on the reference material relative to the reference mark;

(d) detecting the position of a center of an image of a first evaluation mark on the reference material;

(e) detecting the position of a center of an image of a second evaluation mark on the reference material;

(f) determining a distance between the center of the image of the first evaluation mark and the center of the image of the second evaluation mark; and (g) calculating a reduction factor based on the distance between the centers of the images of the first and second evaluation marks on the reference material in comparison to the distance between corresponding first and second evaluation marks.

16. The method of claim 15, wherein step (f) further comprises:

moving the reference mark such that an edge of the reference mark is positioned on the center of the image of the first evaluation mark;

detecting an amount of movement of the reference mark as the reference mark is moved from an initial position to a position on the center of the image of the first evaluation mark, and determining a position to which the reference mark was moved relative to the initial position based on the amount of movement detected;

moving the reference mark such that the edge of the reference mark is positioned on the center of the image of the second evaluation mark;

detecting a second amount of movement of the reference mark as the reference mark is moved from the position at the center of the image of the first evaluation mark to a position on the center of the image of the second evaluation mark, and determining the position to which the reference mark was moved relative to the position at the center of the image of the first evaluation mark; and based on the second amount of movement detected, determining the distance between the centers of the images of the first and the second evaluation marks.

17. The method of claim 16, further comprising the step of correcting the determined distance between the centers of the images of the first and the second evaluation marks for shift error, the correcting step comprising:

moving the image of the first evaluation mark across the edge of the reference mark after moving the edge of the reference mark such that an edge of the reference mark is positioned on the center of the image of the first evaluation mark;

detecting charged particles reflected by the reference mark as the image of the first evaluation mark is moved across the edge of the reference mark;

generating a first set of signals indicative of the amount of charged particles reflected as the image of the first evaluation mark is moved across the edge of the reference mark;

determining a shift amount of the image of the first evaluation mark based on the first set of signals generated;

moving the edge of the reference mark onto the center of the image of the second evaluation mark;

detecting charged particles reflected by the reference mark as the image of the second evaluation mark is moved across the edge of the reference mark;

generating a second set of signals indicative of the amount of charged particles reflected as the image of the second evaluation mark is moved across the edge of the reference mark;

determining a shift amount of the image of the second evaluation mark based on the second set of signals generated; and correcting the determined distance between the centers of the images of the first and the second evaluation marks by subtracting the shift amounts of the images of the first and the second evaluation marks from the determined distance therebetween.

18. The method of claim 17, wherein the step of calculating the reduction factor includes the step of dividing the distance between the centers of the images of the first and the second evaluation marks by the distance between corresponding evaluation marks.

19. The method of claim 16, further including the steps of:

(a) defining a Y axis parallel to a plane defined by a surface of the reference material, and defining an X axis perpendicular to the Y axis and parallel to the plane of the surface of the reference material;

(b) arranging the evaluation marks such that a center of a first evaluation mark is positioned along the Y axis, directly across from a center of a second evaluation mark;

(c) defining a first line parallel with the Y axis, through the center of the first evaluation mark image;

(d) defining a second line parallel with the Y axis, through the center of the second evaluation mark image;

(e) measuring a distance along the X axis between the first and the second lines and recording the distance as a value $\Delta X$; and (f) determining a rotation angle of the first and the second evaluation mark images along the X axis based on the distance $\Delta X$.

20. The method of claim 19, wherein the step of determining the rotation angle of the images of the first and second evaluation marks along the X axis includes the step of dividing the distance $\Delta X$ by the distance between the centers of the images of the first and the second evaluation marks.

21. The method of claim 17, including the step of deflecting the charged particle beam to move the image of the first evaluation mark until the edge of the reference mark crosses the center of the image of the first evaluation mark and recording the resulting amount of deflection of the charged particle beam.

* * * * *

UNITED STATES PATENT AND TRADEMARK OFFICE
CERTIFICATE OF CORRECTION

PATENT NO. : 5,912,467
DATED : June 15, 1999
INVENTOR(S) : Teruaki Okino

It is certified that error appears in the above-identified patent and that said Letters Patent is hereby corrected as shown below:

Column 5, line 30, "factor" should be --factor $\beta$--.

Signed and Sealed this

Twenty-eighth Day of December, 1999

Attest:

Q. TODD DICKINSON

Attesting Officer

Acting Commissioner of Patents and Trademarks